(12) United States Patent
Sugiura

(10) Patent No.: US 7,547,642 B2
(45) Date of Patent: Jun. 16, 2009

(54) MICRO-STRUCTURE MANUFACTURING METHOD

(75) Inventor: Kazuhiko Sugiura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 246 days.

(21) Appl. No.: 11/296,466

(22) Filed: Dec. 8, 2005

(65) Prior Publication Data

US 2006/0128158 A1    Jun. 15, 2006

(30) Foreign Application Priority Data

Dec. 15, 2004    (JP) .............................. 2004-362480

(51) Int. Cl.
*H01L 21/302*    (2006.01)

(52) U.S. Cl. ..................... 438/753; 438/745; 438/750; 216/106

(58) Field of Classification Search ................. 438/745, 438/750, 752, 754; 216/2, 99, 106
See application file for complete search history.

(56) References Cited

U.S. PATENT DOCUMENTS

| | | | |
|---|---|---|---|
| 5,234,540 A | 8/1993 | Grant et al. | |
| 5,616,514 A | 4/1997 | Muchow et al. | |
| 5,616,523 A | 4/1997 | Benz et al. | |
| 5,635,102 A | 6/1997 | Mehta | |
| 5,658,417 A | 8/1997 | Watanabe et al. | |
| 5,662,772 A | 9/1997 | Scheiter et al. | |
| 5,683,591 A | 11/1997 | Offenberg | |
| 6,024,888 A | 2/2000 | Watanabe et al. | |
| 6,076,404 A | 6/2000 | Muchow et al. | |
| 6,174,651 B1* | 1/2001 | Thakur ..................... 430/272.1 |
| 6,318,175 B1 | 11/2001 | Muchow et al. | |
| 6,713,401 B2* | 3/2004 | Yokogawa et al. .......... 438/710 |
| 2002/0052120 A1* | 5/2002 | Shintani et al. ............. 438/734 |
| 2003/0080082 A1* | 5/2003 | Chinn et al. .................... 216/2 |

FOREIGN PATENT DOCUMENTS

| | | | |
|---|---|---|---|
| JP | A-5-275401 | | 10/1993 |
| JP | A-5-304122 | | 11/1993 |
| JP | 002951922 | * | 4/1998 |
| JP | B2-2951922 | | 9/1999 |
| JP | A-2001-129798 | | 5/2001 |

OTHER PUBLICATIONS

Office Action dated Mar. 2, 2009 in corresponding Japanese patent application No. 2004-362480 (and English translation).

* cited by examiner

*Primary Examiner*—Lan Vinh
(74) *Attorney, Agent, or Firm*—Posz Law Group, PLC

(57) ABSTRACT

A method of manufacturing a micro-structure includes dry-etching a sacrificial layer provided to a silicon substrate to form structures the sacrificial layer reacting with etching gas to generate reaction products including $H_2O$, wherein the dry-etching includes etching the sacrificial layer and removing $H_2O$ as one of the reaction products generated through the etching step of the sacrificial layer, wherein the etching and the removing of $H_2O$ are repetitively performed.

24 Claims, 2 Drawing Sheets

MICRO-STRUCTURE MANUFACTURING METHOD

CROSS REFERENCE TO RELATED APPLICATION

This application is based upon, claims the benefit of priority of, and incorporates by reference the contents of, Japanese Patent Application No. 2004-362480 filed on Dec. 15, 2004.

TECHNICAL FIELD

The technical field relates to a micro-structure manufacturing method of manufacturing a structure by dry-etching a sacrificial layer provided to a silicon substrate, and particularly a micro-structure manufacturing method in which a reaction product containing $H_2O$ is generated through the reaction between the sacrificial layer and etching gas.

BACKGROUND

A method using etching gas such as HF (hydrogen fluoride) gas or the like has been proposed as a micro-structure manufacturing method for forming a structure by dry-etching a sacrificial layer provided to a silicon substrate (see, for example, JP-A-5-275401, JP-A-7-99326).

The methods described in the above publications relate to a general dry etching method for a sacrificial layer, and use mixture gas of HF gas and $H_2O$ (water) as etching gas. When $H_2O$ is included as such an etching gas, it has been hitherto known that $H_2O$ has an adverse effect on etching.

Therefore, as the dry-etching method for the sacrificial layer has been proposed a method of using mixture gas of anhydrous HF gas and methanol (MeOH, $CH_3OH$) gas as etching gas without containing $H_2O$ (Japanese Patent No. 2951922).

With respect to a sacrificial layer etching treatment using mixture gas of anhydrous HF gas and methanol gas as etching gas, the etching is carried out according to the reactions represented by the following chemical formulas 1 to 4. Here, the sacrificial layer is $SiO_2$ (silicon oxide).

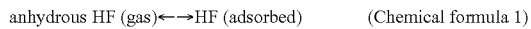   (Chemical formula 1)

   (Chemical Formula 2)

   (Chemical Formula 3)

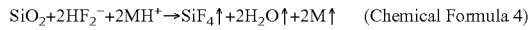   (Chemical Formula 4)

Here, in the chemical formulas 1 to 4, M represents methanol, HF (gas) and HF (adsorbed) represent HF under gas and HF adsorbed by the silicon substrate respectively, and M(gas) and M(adsorbed) represent methanol under gas and methanol adsorbed by the silicon substrate.

As shown in these chemical formulas 1 to 4, in the sacrificial layer etching treatment using the mixture gas of anhydrous HF gas and methanol gas, HF and methanol are adsorbed to the silicon substrate (see the chemical formulas 1 and 2), and HF and methanol adsorbed to the substrate induce the chemical reactions shown in the chemical formulas 3 and 4, whereby $SiO_2$ as the sacrificial layer is etched.

However, as shown in the chemical formula 4, $H_2O$ occurs as a reaction product. $H_2O$ is adsorbed to the silicon substrate again, and reacts with HF gas to etch $SiO_2$ as the sacrificial layer.

As described above, etching dispersion in the silicon substrate plane is induced by $H_2O$ as the reaction product generated by the etching of the sacrifice, so that it is difficult to manage the etching quality and the etching rate.

In order to solve the problem of the etching dispersion caused by the reaction product, Japanese Patent No. 2951922 has proposed a method of preventing occurrence of residual materials by improving the upper and lower film structures of the sacrificial layer. According to this method, even when etching dispersion occurs, an etching stop layer is formed to regulate the etching region.

However, the method disclosed in the above publication needs a complicated structure, and thus increases the cost.

SUMMARY

In view of the foregoing problem, it is an object to reduce the effect of $H_2O$ as a reaction product on etching without needing any complicated structure in a micro-structure manufacturing method in which dry-etching is conducted on a sacrificial layer provided to a silicon substrate to form a structure and reaction products containing $H_2O$ are generated.

In order to attain the above object, in a micro-structure manufacturing method of manufacturing a micro-structure comprising dry-etching a sacrificial layer provided to a silicon substrate to form structures, the sacrificial layer reacting with etching gas to generate reaction products containing $H_2O$, the dry-etching includes etching the sacrificial layer and removing $H_2O$ as one of the reaction products generated by the etching of the sacrificial layer, the etching and the removing being repetitively carried out.

According to the above method, the etching of the sacrificial layer can be advanced while removing the reaction products and residual materials, and thus etching dispersion caused by $H_2O$ as the reaction product can be suppressed.

Accordingly, in the micro-structure manufacturing method in which the sacrificial layer of the silicon substrate is subjected to dry-etching to form the structure and the reaction products containing $H_2O$ are generated, the effect of $H_2O$ as a reaction product on the etching can be reduced without needing any complicated structure.

A mixture gas of anhydrous HF gas and methanol gas may be typically used as the etching gas.

The removing of the $H_2O$ as the reaction product may include removing $H_2O$ by evacuating.

The surrounding around the silicon substrate is set to pressure-reduced atmosphere by the evacuating, so that $H_2O$ as the reaction product can be exhausted and also properly removed.

The evacuating is preferably carried out while applying a pressure variation.

The effect of removing $H_2O$ as the reaction product is enhanced by carrying out evacuating on the silicon substrate while applying a pressure variation, and thus this method is preferable.

The removing of $H_2O$ as the reaction product conducts a purge using dry inert gas on the silicon substrate.

According to the above method, by conducting the purge using the dry inert gas, $H_2O$ as the production reaction which adheres to the silicon substrate or exists in the neighborhood of the silicon substrate can be properly removed together with the inert gas as the purge gas.

The purge using the dry inert gas may be conducted while applying a pressure variation.

The effect of removing $H_2O$ as the reaction product can be increased by conducting the purge using the inert gas on the silicon substrate while varying the pressure applied to the silicon substrate, and thus this method is preferable.

The inert gas used in the purge may be introduced to the silicon substrate from the same position as the etching gas.

The inert gas used in the purge is introduced to the silicon substrate from a different position from the introducing position of the etching gas.

By introducing the inert gas used in the purge from the same position as the etching gas or from a different position from the introducing position of the etching gas, the supply distribution of the inert gas to the silicon substrate can be made uniform.

The inert gas used in the purge is introduced to the silicon substrate while a plane of the silicon substrate at the structure side is oriented to the gravity direction.

According to this method, $H_2O$ as the reaction product generated by the etching of the sacrificial layer is detached from the silicon substrate by the gravitational force. The purge can be efficiently carried out by utilizing this gravitational force, and thus the effect of removing $H_2O$ as the reaction product can be enhanced. Therefore, this is preferable.

The inert gas used in the purge may be introduced to the silicon substrate in a direction along grooves defining the structure in the silicon substrate.

According to this method, the inert gas used in the purge can be made to flow smoothly along the grooves defining the structure in the silicon substrate.

The etching of the sacrificial layer supplies mixture gas of etching gas and carrier gas, and the removing of $H_2O$ as the reaction product supplies carrier gas with excluding the etching gas.

According to the above method, when removing $H_2O$, the etching gas is removed, and the carrier gas is supplied, so that $H_2O$ as the reaction product adhering to the silicon substrate or existing in the neighborhood of the silicon substrate can be properly removed together with the carrier gas.

Dry inert gas can be used as the carrier gas.

When the etching gas is excluded and the carrier gas is supplied, methanol gas may be supplied in addition to the carrier gas when removing $H_2O$ as the reaction product.

According to the above method, methanol has a strong water adsorption property, and thus it has a large effect of removing $H_2O$ as the reaction product. Therefore, this method is preferable.

The removing $H_2O$ as the reaction product may include conducting a heat treatment on the silicon substrate to evaporate $H_2O$ as the reaction product.

The removing $H_2O$ as the reaction product may include irradiating light or electromagnetic waves to remove $H_2O$.

According to the above method, by irradiating light or electromagnetic waves, $H_2O$ as the reaction product is decomposed or evaporated, so that $H_2O$ can be properly removed.

BRIEF DESCRIPTION OF THE DRAWINGS

Additional objects, features and advantages will be best understood from the following description, the appended claims and the accompanying drawings in which:

DETAILED DESCRIPTION

Figure 1A:
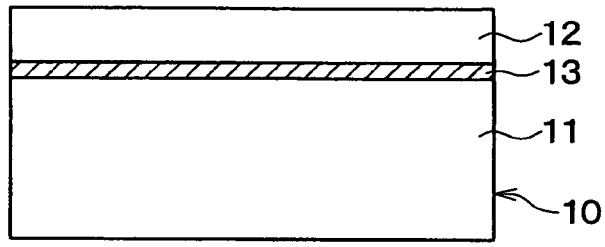
FIGS. 1A to 1D are schematic cross-sectional views showing a method of manufacturing a capacitance type acceleration sensor according to an embodiment.

A preferred embodiment will be described hereunder with reference to the accompanying drawings. In the following figures, the same or equivalent elements are represented by the same reference numerals to simplify the description.

FIGS. 1A to 1D are cross-sectional views showing a method of manufacturing a capacitance type acceleration sensor 100 as a micro-structure according to an embodiment. The manufacturing method of this embodiment manufactures the sensor 100 shown in FIG. 1D as a final product, and the construction of the sensor will be first briefly described with reference to FIG. 1D.

The acceleration sensor 100 of this embodiment is equipped with an SOI (Silicon On Insulator) substrate 10 as the silicon substrate. The SOI substrate 10 is achieved by laminating a first silicon layer 11 and a second silicon layer 12 through buried oxide film 13 as a sacrificial layer. The first silicon layer 11 is constructed as a support portion (support substrate) 11.

A cavity 14 is formed at the center portion of the SOI substrate 10 by removing the buried oxide film 13. Furthermore, grooves 15 are formed in the second silicon layer 12 corresponding to the cavity 14 so as to penetrate through the second silicon layer 12 from the upper surface thereof to the cavity 14 in the thickness direction.

The second silicon layer 12 is sectioned into a movable electrode 16 and a fixed electrode 17 by the grooves 15. In this embodiment, the movable electrode 16 and the fixed electrode 17 are alternately arranged, and they are adjacent to each other through each groove 15.

The movable electrode 16 is kept to be released from the support portion 11 of the SOI substrate 10 through the cavity 14, and is movable with respect to the substrate 10. That is, the movable electrode 16 is constructed as a movable portion, and the fixed electrode 17 is constructed as a fixed portion. Both the movable electrode 16 and the fixed electrode 17 are constructed as structures.

Although not shown, the fixed electrode 17 is fixedly mounted on the first silicon layer 11 through the buried oxide film 13, and the movable electrode 16 is elastically supported through a beam or the like so as to be movable with respect to the first silicon layer 11.

The movable and fixed electrodes 16 and 17 may be designed as well-known comb-shaped beam structures. In the embodiment shown in FIGS. 1A to 1D, the comb-shaped movable electrode 16 and the comb-shaped fixed electrode 17 are disposed so as to be spaced from each other through the grooves 15 extending in the vertical direction on the drawing sheet of FIG. 1.

In this case, the movable electrode 16 is displaced under application of an acceleration, so that the distance between the movable electrode 16 and the fixed electrode 17 (that is, the width of the grooves 15) is varied. The applied acceleration can be detected by detecting the capacitance variation between both the electrodes 16 and 17 based on the distance variation, for example.

Furthermore, an electrode portion 18 is a wire portion formed of Al (aluminum) or the like is formed at the peripheral portion on the upper surface of the second silicon layer 12. The electrode portion 18 is constructed as various kinds of wires or pads for external connection in the sensor 100.

The capacitance variation between the movable and fixed electrodes 16 and 17 can be output as an electrical signal through the electrode portion 18. As described above, according to this embodiment, the capacitance type acceleration sensor 100 as the micro-structure having the structures 16 and 17 can be constructed.

Next, a method of manufacturing the micro-structure 100, that is, the acceleration sensor 100 according to the embodiment will be described with reference to FIGS. 1A to 1D.

Figure 1B:
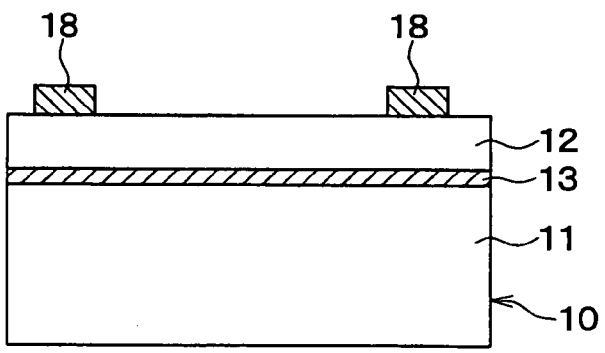
Figure 1C:
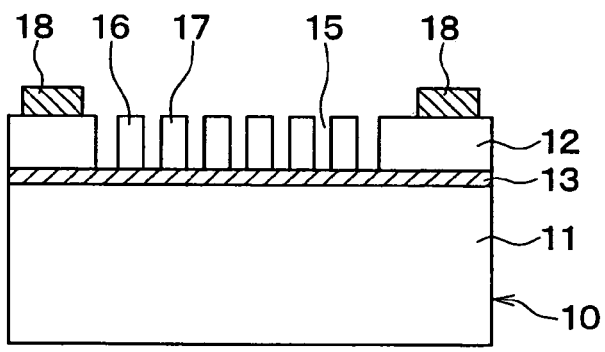

As shown in FIGS. 1A and 1B, the SOI substrate 10 as the silicon substrate is first prepared, and the electrode portion 18 as the wire portion is formed on the SOI substrate 10 (a wire portion forming step).

When the electrode portion 18 is formed, a wire material used in a normal semiconductor process may be used as the material of the electrode portion 18. For example, the electrode portion 18 is formed of Al (aluminum) or the like by sputtering or vapor deposition.

The electrode 18 may be also formed by a drawing or printing system. As the drawing system of forming the electrode portion 18 may be used an ink jetting method using fine powder of wire portion constituting material, a vapor deposition method using a nozzle or the like, and as the printing system may be used a normal screen method or the like.

Next, the grooves 15 described above are formed as trenches for sectioning and forming the movable electrode 16 and the fixed electrode 17, that is, the structures from the upper surface side of the SOI substrate 10 (the surface, the upper surface of the second silicon layer 12) (trench forming step).

The trench forming step can be executed by a normal photo-etching step. Specifically, dry-etching using a pattern formed by photoresist or the like is carried out in order to form the structures 16 and 17.

The dry-etching may be carried out by using etching gas such as $SF_6$ gas or the like. The residual portion remaining through the etching step is set as the structures 16 and 17. Thereafter, the photoresist is removed by a normal method. Here, in this embodiment using the SOI substrate 10, the etching is stopped by the buried oxide film 13, and thus the controllability of the etching is excellent.

Figure 1D:
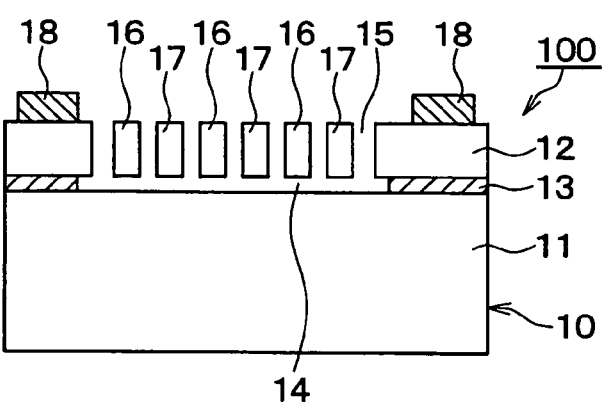

Subsequently, as shown in FIG. 1D, the buried oxide film 13 as the sacrificial layer at the site which will serve as the cavity 14 is removed by dry-etching to release the movable electrode 16, thereby making the movable electrode 16 movable (sacrificial layer etching step).

That is, release etching using the buried oxide film 13 as the sacrificial layer is carried out to form the movable electrode 16 which is kept to be released from the SOI substrate 10. In the dry-etching applied to the sacrificial layer 13, reaction products containing $H_2O$ are generated by the reaction between the sacrificial layer 13 and the etching gas.

Specifically, in the etching of the buried oxide film 13, the buried oxide film 13 is selectively removed by the dry-etching using the mixture gas of anhydrous HF gas and methanol gas as the etching gas.

In the prior art, the step of removing the buried oxide film 13 can be carried out by wet-etching using hydrofluoric acid solution as etching solution. However, in the step of removing the oxide film 13, when the wet process is used, sticking occurs because the movable electrode 16 is kept movable after the etching.

Therefore, it is preferable to use the dry-etching, that is, the dry process as described above. After the movable electrode 16 as the movable portion is set to the movable state, sticking would occur if a cleaning work based on a wet process is carried out. Therefore, it is impossible to carry out the cleaning work based on the wet process afterwards.

Here, the dry-etching of the buried oxide film 13 which uses the mixture of anhydrous HF gas and methanol gas as the etching gas is specifically carried out the etching based on the reactions represented by the chemical formulas 1 to 4.

The sacrificial layer etching may be carried out by using a normal dry-etching device having an etching chamber whose internal pressure can be controlled. For example, the etching chamber is designed so that the etching gas corresponding the mixture gas of anhydrous HF gas and methanol gas can be introduced from the introducing port into the chamber while controlling the mixture ratio of anhydrous HF gas and methanol.

The etching of the buried oxide film 13 is carried out under the internal pressure of the etching chamber which is set to about several Torr to several hundreds Torr, for example.

Furthermore, in the etching process of the buried oxide film 13 as the sacrificial layer, the reaction products containing $H_2O$ are generated through the reaction between the sacrificial layer 13 and the etching gas as represented by the chemical formulas 1 to 4.

Therefore, in the sacrificial layer etching step of this embodiment, as a unique method, the step of etching the buried oxide film 13 as the sacrificial layer and the step of removing $H_2O$ as the reaction product generated through the etching of the buried oxide film 13 are repetitively carried out. The etching of the buried oxide film 13 is carried out by the dry-etching described above.

Here, in this embodiment, various methods described below will be adopted in the step of removing $H_2O$ as the reaction product. The following methods are unique methods, however, persons skilled in the art would readily implement these methods by using a general dry-etching device and applying some design changes to the device if these methods are presented.

First Method: the step of removing $H_2O$ as the reaction product is carried out by carrying out vacuum evaporation on the silicon substrate 10. Specifically, evacuating is carried out through an exhaust port of the etching chamber by a vacuum pump. Here, FIGS. 2A and 2B are cross-sectional views showing the first method.

Figure 2A:
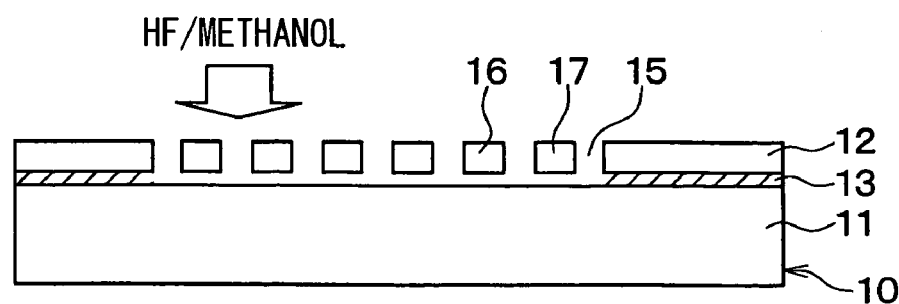
FIGS. 2A and 2B are schematic cross-sectional views showing a sacrificial layer etching process of the manufacturing method of this embodiment.

As shown in FIG. 2A, the etching gas (HF/methanol) is introduced into the etching chamber to etch the buried oxide film 13 for a fixed time, and then the process enters the evacuating step.

Figure 2B:
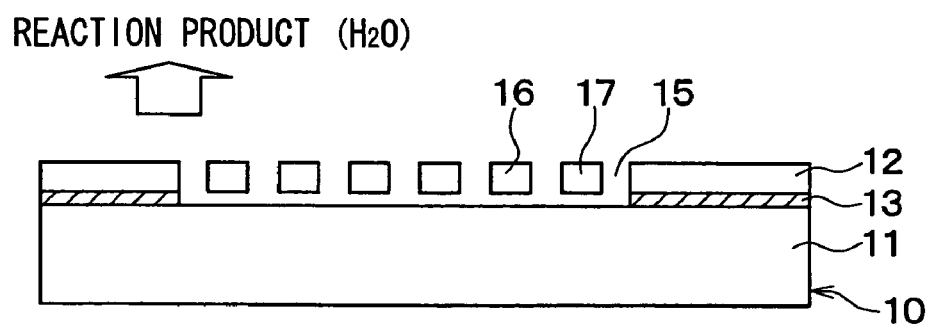

Accordingly, as shown in FIG. 2B, the surrounding of the silicon substrate 10 is set to a pressure-reduced atmosphere, so that $H_2O$ as the reaction product can be properly removed together with exhaust gas. Furthermore, etching gas is introduced again, and the etching of the buried oxide film 13 is repeated. This is the first method.

Here, in the first method, the evacuating is set to the pressure for carrying out the etching of the buried oxide film 13. For example, it may be performed under pressure smaller than the pressure of about several Torr to several hundreds Torr.

The evacuating increases/reduces the pressure in the range of the evacuating concerned. That is, it is preferable to carry out the evacuating while applying a pressure variation of a fixed range or more. As described above, the effect of removing $H_2O$ as the reaction product is enhanced by carrying out evacuating on the silicon substrate while applying a pressure variation. Therefore, this method is preferable.

Second Method: in the step of removing $H_2O$ as the reaction product, purge using dried inner gas is carried out on the silicon substrate 10.

Specifically, as shown in FIG. 2A, the etching gas (HF/methanol) is introduced into the etching chamber to etch the buried oxide film 13 for a fixed time, and then the purging step is carried out.

Accordingly, as shown in FIG. 2B, H$_2$O as the reaction product adhering to the silicon substrate 10 or existing in the neighborhood of the silicon substrate 10 can be properly removed together with inert gas as purge gas. Furthermore, the etching gas is introduced again, and the etching of the buried oxide film 13 is repeated. This is the second method.

In this case, nitrogen (N$_2$) gas, Ar, He or the like is usable as the inert gas used for the purging step. In this second method, it is preferable to execute the purging step while applying a pressure variation.

The effect of removing H$_2$O as the reaction product can be enhanced by carrying out the purging step on the silicon substrate 10 while applying a pressure variation as described above, and thus this method is preferable.

In the second method based on the purging step using the dry inert gas, the effect of removing H$_2$O as the reaction product can be further enhanced by using a proper inert gas flowing manner.

Specifically, the inert gas used for the purging step is introduced to the silicon substrate 10 from the same position as the etching gas. That is, the inert gas is introduced from the same introducing port as the etching gas in the etching chamber.

Furthermore, in the second method, the inert gas used for the purge may be introduced to the silicon substrate 10 from a position different from the introducing position of the etching gas. Furthermore, plural introducing ports for introducing inert gas used for the purge are provided, and one of the introducing ports is set as the same introducing port as the etching gas while the other introducing ports are set as introducing ports different from that of the etching gas.

As described above, the inert gas used for the purge is introduced from the same introducing port as the etching gas or from both the same introducing port as the etching gas and an introducing port different from that of the etching gas, whereby the supply distribution of the inert gas to the silicon substrate 10 can be made uniform.

Furthermore, in the second method, the inert gas used for the purge may be introduced to the silicon substrate 10 while a surface of the silicon substrate 10 at which the structures 16 and 17 are located is oriented to the gravitational direction. This is implemented by carrying out both the etching step of the buried oxide film 13 and the purging step while the silicon substrate 10 of FIG. 2 is turned upside down when the up-and-down direction of FIG. 2 is set to the vertical direction on the earth.

According to the above method, H$_2$O as the reaction product generated through the etching step of the buried oxide film 13 as the sacrificial layer falls off from the silicon substrate 10 by the gravitational force. Accordingly, the purge can be efficiently carried out by using this gravity action, and thus the effect of removing H$_2$O as the reaction product can be enhanced. Therefore, this method is preferable.

Furthermore, in the second method, the inert gas used for the purge may be introduced to the silicon substrate 10 in the direction along the grooves 15 defining the structures 16 and 17 on the silicon substrate 10.

Specifically, in FIGS. 2A-2B, the grooves 15 defining the structures 16 and 17 of the silicon substrate 10 extend in the vertical direction of the drawing surface, and in this case the inert gas used for the purge is introduced in the same direction.

According to this method, the inert gas used for the purge can be made to smoothly flow along the grooves 15 defining the structures 16 and 17 of the silicon substrate 10, and thus the purge can be efficiently performed. Therefore, the effect of removing H$_2$O as the reaction product can be enhanced, and this method is preferable.

Third Method: In this embodiment, when the mixture gas of etching gas and carrier gas is supplied in the step of etching the buried oxide film 13 as the sacrificial layer, the carrier gas excluding the etching gas is supplied in the step of removing H$_2$O as the reaction product.

Specifically, as shown in FIG. 2A, dry inert gas such as dry nitrogen gas, Ar, He or the like is used as carrier gas, and the etching gas (HF/methanol) is introduced into the etching chamber together with the carrier gas to etch the buried oxide film 13 for a fixed time.

Subsequently, the process shifts to a step of continuing to supply the inert gas as the carrier gas and stopping supply of only HF/methanol as the etching gas to thereby remove H$_2$O as the reaction product.

Accordingly, as shown in FIG. 2B, H$_2$O adhering to the silicon substrate 10 or existing in the neighborhood of the silicon substrate 10 can be properly removed together with the carrier gas. Furthermore, the etching gas is introduced again, and the etching of the buried oxide film 13 is repeated. This is the third method.

In this case, the etching step of the buried oxide film 13 and the removing step of H$_2$O as the reaction product can be continuously performed. In addition, the etching can be performed without varying etching parameters such as the pressure and temperature in the etching chamber serving as a reaction chamber, and the etching stability can be enhanced.

Furthermore, according to the third method, in the step of removing H$_2$O as the reaction product, when the etching gas is excluded and only the carrier gas is supplied, it is preferable to supply methanol gas in addition to the carrier gas.

According to this method, methanol has a strong adsorption property to water, and thus it has a large effect of removing H$_2$O as the reaction product. Therefore, this method is preferable.

As described above, the acceleration sensor 100 as the micro-structure of this embodiment can be completed through the wire portion forming step, the trench forming step and the sacrificial layer etching step.

Next, the effect, etc. of this embodiment will be described in the summarized form.

According to this embodiment, in the manufacturing method of forming the structures 16 and 17 by dry-etching the sacrificial layer 13 in the silicon substrate having the sacrificial layer 13 in which the reaction products containing H$_2$O are generated through the reaction between the sacrificial layer 13 and the etching gas, there is provided a manufacturing method of a micro-structure 100 characterized in that the step of etching the sacrificial layer 13 and the step of removing H$_2$O as the reaction product generated by the etching of the sacrificial layer 13 are repetitively carried out.

According to the above method, the etching of the sacrificial layer 13 can be advanced while removing the reaction products and the residual materials, and thus the etching dispersion caused by H$_2$O as the reaction product can be suppressed.

Accordingly, according to this embodiment, in the method of manufacturing the micro-structure 100 in which the structures 16 and 17 are formed by dry-etching the sacrificial layer 13 provided to the silicon substrate 10 and also the reaction products containing H$_2$O are generated, the effect of H$_2$O as the reaction product on etching can be reduced without needing a complicated structure.

Here, in the manufacturing method of this embodiment, the step of removing H$_2$O as the reaction product may contain a step of evacuating the silicon substrate 10. The surrounding around the silicon substrate 10 is set to a pressure-reduced atmosphere by evacuating, so that $H_2O$ as the reaction product can be exhausted and properly removed.

In the manufacturing method of this embodiment, the evacuating may be carried out while applying a pressure variation. By carrying out the evacuating on the silicon substrate 10 while applying a pressure variation, the effect of removing $H_2O$ as the reaction product can be enhanced.

Furthermore, in the manufacturing method of this embodiment, the step of removing $H_2O$ as the reaction product includes the step of carrying out the purging using the dry inert gas on the silicon substrate 10. According to this method, $H_2O$ as the reaction product adhering to the silicon substrate 10 or existing in the neighborhood of the silicon substrate 10 can be properly removed together with the inert gas as the purge gas.

Still furthermore, in the manufacturing method of this embodiment, the purge using the dry inert gas is performed while applying a pressure variation. According to this method, the effect of removing $H_2O$ as the reaction product can be enhanced, and thus this method is preferable.

Still furthermore, in the manufacturing method of this embodiment, the inert gas used for the purge is introduced from the same position as the etching gas, or the inert gas used for the purge is introduced from a position different from that of the etching gas. According to this method, the supply distribution of the inert gas to the silicon substrate 1 can be made uniform.

In the manufacturing method of this embodiment, the inert gas used for the purge is introduced to the silicon substrate 10 while the surface of the silicon substrate 10 at which the structures 16, 17 are located is oriented in the gravity direction. According to this method, $H_2O$ as the reaction product falls down by the gravitational force, and thus the effect of removing $H_2O$ can be enhanced.

Furthermore, in the manufacturing method of this embodiment, the inert gas used for the purge is introduced to the silicon substrate 10 from the direction along the grooves 15 defining the structures 16 and 17 of the silicon substrate 10. According to this method, the inert gas used for the purge can be made to smoothly flow along the grooves 15.

In the manufacturing method of this embodiment, when the etching of the sacrificial layer 13 includes supplying the mixture gas of etching gas and carrier gas, the removing of $H_2O$ as the reaction product includes supplying the carrier gas with excluding the etching gas.

According to the above method, by supplying the carrier gas with excluding the etching gas in the step of removing $H_2O$, $H_2O$ as the reaction product adhering to the silicon substrate 10 or existing in the neighborhood of the silicon substrate 10 can be properly removed together with the carrier gas.

Furthermore, in the manufacturing method of this embodiment, in the step of removing $H_2O$ as the reaction product, when the carrier gas is supplied with excluding the etching gas, methanol is also supplied in addition to the carrier gas. According to this method, the effect of removing $H_2O$ can be enhanced by utilizing the water removing property of methanol as described above.

Other Embodiments

In the above embodiment, the removing $H_2O$ as the reaction product is executed according to the first to third methods. As another method, $H_2O$ as the reaction product may be evaporated by subjecting the silicon substrate 10 to a heat treatment.

For example, the sacrificial layer is etched under the state that the silicon substrate 10 is mounted in a temperature or the like temperature-controllable by current supply in the etching chamber, and then the temperature of the silicon substrate 10 is increased by the heater to evaporate $H_2O$. This cycle is repeated.

The removing of $H_2O$ as the reaction product may irradiate light or electromagnetic wave to the silicon substrate 10.

For example, light irradiation of ultraviolet ray (UV) is carried out to decompose $H_2O$ as the reaction product, thereby removing $H_2O$. Furthermore, by irradiating electromagnetic wave, $H_2O$ is decomposed or evaporated by the heat or energy of the electromagnetic wave, thereby removing $H_2O$.

Furthermore, the heat treatment or the irradiation of light or electromagnetic wave to the silicon substrate 10 is properly combined with the first to third methods as the step of removing $H_2O$ as the reaction product, so that it is expected that the effect of removing $H_2O$ as the reaction product can be further enhanced.

Still furthermore, in the above embodiment, forming of the trench includes forming the structures 16 and 17 by etching the silicon substrate 10. However, the formation of the structures 16 and 17 is not limited to etching, and for example, they may be formed by mechanical machining. Thereafter, the sacrificial layer is etched to make the movable electrode 16 released.

In the above embodiment, the SOI substrate 10 is used as the silicon substrate. However, the present invention is not limited to the SOI substrate, and any silicon substrate may be used insofar as it has a sacrificial layer.

Furthermore, the present invention is not limited to the capacitance type acceleration sensor, and the present invention may be applied to any element insofar as the sacrificial layer provided to the silicon substrate is dry-etched to form the structures and generate the reaction products containing $H_2O$. For example, the present invention may be applied to an angular velocity sensor or a pressure sensor.

In short, according to the present invention, in the microstructure manufacturing method in which the sacrificial layer of the silicon substrate is dry-etched to form the structures and the sacrificial layer reacts with the etching gas to generate $H_2O$ through the reaction between the sacrificial layer and the etching gas, etching of the sacrificial layer includes repeatedly etching the sacrificial layer and removing $H_2O$ as the reaction product generated by the etching of the sacrificial layer. The other detailed matters can be properly changed according to design demands, etc.

What is claimed is:

1. A method of manufacturing a micro-structure comprising:

dry-etching a sacrificial layer provided to a silicon substrate, the sacrificial layer including a buried oxide layer having a cavity formed by the dry-etching, the substrate including a first silicon layer and a second silicon layer, to form structures, the sacrificial layer reacting with etching gas to generate reaction products including $H_2O$, and forming grooves in the second silicon layer corresponding to the cavity to penetrate through the second silicon layer from the upper surface to the cavity in the thickness direction, wherein the dry-etching includes etching the sacrificial layer and removing $H_2O$ as one of the reaction products generated through the etching step of the sacrificial layer, wherein the etching and the removing of $H_2O$ are repetitively performed, wherein the etching gas comprises a mixture gas of anhydrous HF gas and methanol gas and the sacrificial layer is formed of $SiO_2$, the anhydrous HF gas and the methanol gas (M) and the sacrificial layer reacting according to the following reaction formulas:

$$\text{anhydrous HF gas} \leftrightarrow \text{HF (adsorbed)};$$

$$M \leftrightarrow M \text{ (adsorbed)};$$

$$2HF + M \rightarrow HF_2^- + MH+;$$

$$SiO_2 + 2HF_2^- + 2MH + SiF_4\uparrow + 2H_2O\uparrow + 2M\uparrow.$$

2. The method according to claim 1, wherein the removing of $H_2O$ as the reaction product further includes conducting a heat treatment on the silicon substrate to evaporate $H_2O$ as the reaction product.

3. The method according to claim 1, wherein the removing of $H_2O$ as the reaction product further includes irradiating light or electromagnetic waves to remove $H_2O$.

4. The method according to claim 1, wherein the removing of $H_2O$ as the reaction product further comprises removing $H_2O$ by evacuating.

5. The method according to claim 1, wherein the removing of $H_2O$ as the reaction product further includes conducting a purge using dry inert gas on the silicon substrate.

6. The method according to claim 1, further comprising forming a wire portion on the substrate.

7. The method according to claim 1, wherein the structures include movable electrodes and fixed electrodes having a comb-shaped beam structure.

8. The method according to claim 1, wherein the removing of $H_2O$ as the reaction product further comprises removing $H_2O$ by evacuating.

9. The method according to claim 8, wherein the evacuating is carried out while applying a pressure variation.

10. The method according to claim 1, wherein the structures include a movable electrode and a fixed electrode.

11. The method according to claim 10, wherein the silicon substrate is a silicon on insulator (SOI) substrate and includes the first layer and the second layer, and wherein the method further comprises:

forming the cavity at a center portion of the SOI substrate by removing the buried oxide layer with the dry-etching; and sectioning the second silicon layer into the movable electrode and the fixed electrode.

12. The method according to claim 1, wherein the etching of the sacrificial layer further includes supplying a mixture gas of etching gas and carrier gas, and the removing of the $H_2O$ as the reaction product further includes supplying carrier gas excluding the etching gas.

13. The method according to claim 12, wherein dry inert gas is used as the carrier gas.

14. The method according to claim 13, wherein when the etching gas is excluded and the carrier gas is supplied, methanol gas is supplied in addition to the carrier gas when removing $H_2O$ as the reaction product.

15. The method according to claim 12, wherein when the etching gas is excluded and the carrier gas is supplied, methanol gas is supplied in addition to the carrier gas when removing $H_2O$ as the reaction product.

16. The method according to claim 1, wherein the removing of $H_2O$ as the reaction product includes conducting a purge using dry inert gas on the silicon substrate.

17. The method according to claim 16, wherein the purge using the dry inert gas is conducted while applying a pressure variation.

18. The method according to claim 17, wherein the inert gas used in the purge is introduced to the silicon substrate from the same position as the etching gas.

19. The method according to claim 16, wherein the inert gas used in the purge is introduced to the silicon substrate from the same position as the etching gas.

20. The method according to claim 16, wherein the inert gas used in the purge is introduced to the silicon substrate from a different position from the introducing position of the etching gas.

21. The method according to claim 16, wherein the inert gas used in the purge is introduced to the silicon substrate while a plane of the silicon substrate at the structure side is oriented to gravity direction.

22. The method according to claim 16, wherein the inert gas used in the purge is introduced to the silicon substrate in a direction along grooves defining the structure in the silicon substrate.

23. The method according to claim 1, wherein the silicon substrate is a silicon on insulator (SOI) substrate and includes the first layer and the second layer, and wherein the method further comprises forming the cavity at a center portion of the SOI substrate by removing the buried oxide layer with the dry-etching.

24. The method according to claim 23, further comprising sectioning the second silicon layer into the movable electrode and the fixed electrode.

* * * * *